United States Patent [19]

Desai

[11] Patent Number: 4,799,983
[45] Date of Patent: Jan. 24, 1989

[54] MULTILAYER CERAMIC SUBSTRATE AND PROCESS FOR FORMING THEREEOR

[75] Inventor: Kamalesh S. Desai, Wappingers Falls, N.Y.

[73] Assignee: International Business Machines Corporation, Armonk, N.Y.

[21] Appl. No.: 75,709

[22] Filed: Jul. 20, 1987

[51] Int. Cl.⁴ .................. C04B 37/02; C04B 33/02
[52] U.S. Cl. ........................... 156/89; 428/209; 428/210; 428/437; 428/524; 264/58; 264/62
[58] Field of Search ............... 428/210, 432, 901; 156/89, 325; 264/60, 63, 104, 61, 62, 57, 58, 59

[56] References Cited

U.S. PATENT DOCUMENTS

| | | | |
|---|---|---|---|
| 3,247,573 | 4/1966 | Noack | 29/155.5 |
| 3,423,517 | 1/1969 | Arrhenius | 174/68.5 |
| 3,723,176 | 3/1973 | Theobald et al. | 117/212 |
| 3,800,020 | 3/1974 | Parfet | 264/104 |
| 3,882,059 | 5/1975 | Elderbaum | 29/25.42 |
| 4,020,234 | 4/1977 | Gardner | 428/440 |
| 4,346,516 | 8/1982 | Yokouchi et al. | 29/845 |
| 4,510,000 | 4/1985 | Kumar | 427/96 |
| 4,552,615 | 11/1985 | Amendola | 427/99 |
| 4,572,754 | 2/1986 | Bloom | 428/210 |
| 4,586,972 | 5/1986 | Yokotani et al. | 156/89 |
| 4,614,837 | 9/1986 | Kane et al. | 428/901 |
| 4,649,125 | 3/1987 | Takeuchi et al. | 150/89 |
| 4,672,152 | 6/1987 | Shinohara | 428/210 |
| 4,696,851 | 9/1987 | Pryor | 428/901 |

OTHER PUBLICATIONS

Acosta et al., "Planarization of Copper Circuits for Multilevel Ceramic Package", IBM Technical Disclosure Bulletin, vol. 26, No. 10B, 5378 (Mar. 1984).

Desai et al., "Screen Printing on Indented Ceramic Green Sheets", IBM Technical Disclosurre Bulletin, vol. 16, No. 11, 3561 (Apr. 1974).

Desai et al., "Adhesion Promotion to Green Ceramic Sheets", IBM Technical Disclosure Bulletin, vol. 16, No. 11, 3563 (Apr. 1974).

*Primary Examiner*—Ellis P. Robinson
*Assistant Examiner*—Donald J. Loney
*Attorney, Agent, or Firm*—Ira David Blecker

[57] ABSTRACT

A process for forming a multi-layer ceramic substrate. The process includes the steps of obtaining a plurality of ceramic sheets in the green state, depositing a conductive metal pattern on at least one of the green ceramic sheets, heating the at least one green ceramic sheet so as to soften it, pressing the conductive metal pattern into the at least one green ceramic sheet, stacking and laminating the green ceramic sheets so as to form a substrate and then sintering the substrate. There is also disclosed a multi-layer ceramic substrate having a conductive metal pattern pressed into the at least one green ceramic sheet.

11 Claims, 1 Drawing Sheet

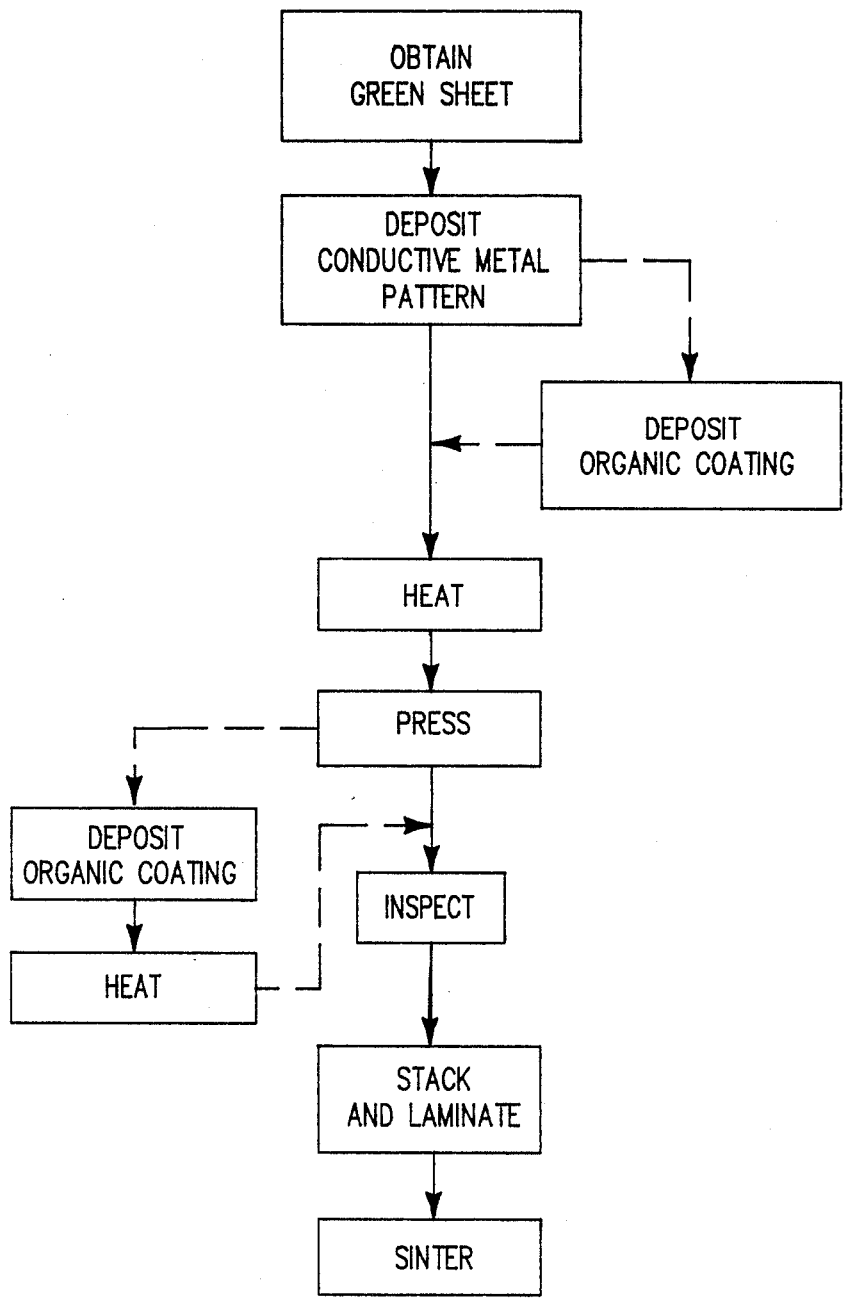

MULTILAYER CERAMIC SUBSTRATE AND PROCESS FOR FORMING THEREFOR

FIELD OF THE INVENTION

This invention relates to the field of multi-layered ceramic structures and particularly to those multi-layered ceramic structures having conducting patterns therein for interconnecting a plurality of electrical devices and components.

BACKGROUND OF THE INVENTION

Multi-layered ceramic structures are, of course, well known. In these ceramic structures, a plurality of ceramic sheets in the green, unsintered state are stacked and laminated together. Each of the sheets usually has a metallic conducting pattern or circuitry on its surface. Interconnections between circuitry on different sheets are achieved by vias. Finally, the stacked and laminated ceramic structure is sintered to form a substrate. Such substrates are disclosed in, for example, Arrhenius U.S. Pat. No. 3,423,517 and Theobald et al. U.S. Pat. No. 3,723,176, which are incorporated by reference herein.

It has been found, however, that defects, such as debris and line spreading (or blooming) are generated during the handling and stacking operations. These defects usually manifest themselves as electrical shorts and opens. Since these defects may not be discovered until after the multi-layered ceramic (MLC) substrate is formed, thereby leading to a defective and nonrepairable substrate, it would be desirable to avoid them if possible. It is believed that these defects are due, at least in part, to the fact that the conducting metal pattern or circuitry is not flush with the surface of the ceramic sheet before each of the green sheets is stacked and laminated.

Various alternative methods of manufacturing an electrical substrate have been proposed. In Parfet U.S. Pat. No. 3,800,020, which is incorporated by reference herein, there is disclosed a process wherein powdered metal, on a heated sheet of thermoplastic resin, is forced into the sheet with a die having the embossed circuit pattern on the surface. The remaining powdered metal not forced into the sheet is removed.

Elderbaum U.S. Pat. No. 3,882,059, which is incorporated by reference herein, discloses a process for producing capacitors comprising the steps of placing a conductive metal pattern on a release surface, placing a ceramic sheet on the pattern and release surface and then peeling away the ceramic sheet and pattern from the release surface.

Yokouchi et al. U.S. Pat. No. 4,346,516, which is incorporated by reference herein, discloses forcing metal balls into a green ceramic sheet. The metal balls serve the function of vias in that they connect the conductive wiring patterns of upper and lower layers.

In Noack U.S. Pat. No. 3,247,573, which is incorporated by reference herein, the conductive elements are formed by casting a ceramic slurry around the elements.

R. Acosta et al. in "Planarization Of Copper Circuits For Multilevel Ceramic Package", TBM Technical Dislosure Bulletin, Vol. 26, No. 10B, 5378 (March 1984), which is incorporated by reference herein, discloses the embedding of copper conductors in a polymeric matrix by heating the polymer and then pressing the copper conductors into the polymeric matrix. Thereafter, an additional polymeric layer may be applied.

Desai et al. in "Screen Printing On Indented Ceramic Green Sheets", IBM Technical Disclosure Bulletin, Vol. 16, No. 11, 3561 (April 1974), discloses hot stamping an indentation into a ceramic green sheet which has been previously coated with polyvinyl alcohol. Thereafter, a paste is squeegeed onto the ceramic green sheet to fill the indentation. Desai et at. in "Adhesion Promotion To Green Ceramic Sheets", IBM Technical Disclosure Bulletin, Vol. 16, No. 11, 3563 (April 1974), discloses the coating of a ceramic sheet with an organic resin. Both of these disclosures are incorporated by reference herein.

Notwithstanding the work of those skilled in the art, as illustrated by the above references, there does not yet appear to be a solution to the problem of defects in MLC substrates.

Accordingly, it is an object of this invention to have a way to reduce the defects in MLC substrates.

It is a further object of the invention to have such a way of reducing defects in MLC substrates which is both effective and practical in use.

These and other objects of the invention will become more apparent after referring to the following description considered in conjunction with the accompanying drawing.

BRIEF SUMMARY OF THE INVENTION

There is disclosed a process for forming a multi-layer ceramic substrate. The process comprises the steps of obtaining a plurality of ceramic sheets in the green state, depositing a conductive metal pattern on at least one of the green ceramic sheets, heating the at least one green ceramic sheet so as to soften it, pressing the conductive metal pattern into the at least one green ceramic sheet, stacking and laminating the green ceramic sheets so as to form a substrate and then sintering the substrate.

There is also disclosed a multi-layer ceramic substrate having a conductive metal pattern pressed into at least one green ceramic sheet.

BRIEF DESCRIPTION OF THE DRAWING

The FIGURE is a flow chart illustrating the process according to the invention.

DETAILED DESCRIPTION OF THE INVENTION

Referring now to the FIGURE, there is disclosed according to the invention a process for forming a multi-layer ceramic substrate. In the first step the process comprises obtaining a plurality of ceramic sheets in the green state. These ceramic sheets may be obtained by mixing a ceramic material or several ceramic materials with suitable organic binders, plasticizers, solvents and other conventional additives (hereinafter the binder composition) to obtain a castable slip or slurry from which thin sheets were cast using conventional doctor blading techniques. A particularly preferred binder material is polyvinyl butyral resin. Thereafter a conductive metal pattern is deposited on at least one of the green ceramic sheets. The conductive metal pattern may be deposited by any convenient method, such as screening, as is well known to those skilled in the art. The conductive metal pattern forms the internal circuitry of the finished substrate.

The next step of the method comprises heating the at least one green ceramic sheet so as to soften it. By heating the green ceramic sheet above room temperature the binder material becomes soft so that the ceramic sheet while in the green state will also become soft. At this point while the green ceramic sheet is soft, the conductive metal pattern is pressed into the at least one green ceramic sheet. The step of pressing may be conveniently accomplished by a simple metal plate or platen which presses against the conductive metal pattern. The green sheet, at this juncture of the process, is usually inspected for line spacing, shorts and open defects. Thereafter the method comprises the steps of stacking and laminating the green ceramic sheets so as to form a substrate and then sintering the substrate.

It has been found that substrates processed according to the invention do not suffer from line spreading. The green sheets with the embedded circuitry are also easier to maintain free of debris in that any debris that happens onto the green sheet may be conveniently removed without damaging the circuitry.

It is expected that a number of ceramic materials will work satisfactorily with the process according to the invention. However, a preferred material is alumina, $Al_2O_3$. Also preferred for use in the invention are the glass ceramic materials which are disclosed in Kumar et al. U.S. Pat. Nos. 4,301,324 and 4,413,061 which are incorporated by reference herein. Of the glass ceramics disclosed in the Kumar et al. patents the preferred glass ceramics are those of the spodumene and cordierite type glass ceramics. A common feature of these sintered glass ceramics among others is their excellent sinterability and crystallization below about 1000° C. and their low dielectric constants. The sintering temperature for the alumina ceramics is in excess of about 1400° C. It must be appreciated then that in the process according to the invention the sintering temperature of the substrate must be adjusted according to the ceramic material used in the substrate, as is well known to those skilled in the art.

Generally, the step of heating will be at a temperature of about 60°–90° C. which is a temperature just sufficient to soften the organic binder composition. Again, generally, the step of pressing will be at a pressure of about 50 to 500 pounds per square inch (psi) which is just sufficient to press the conductive metal pattern into the softened green sheet. The pressure will normally be applied for about 30 to 120 seconds. The temperatures, pressures and times will vary somewhat depending on the constitution of the binder composition. Thus, the temperatures, pressures and times specified above are to be considered as guides for the proper application of the invention and may be adjusted as appropriate.

In a particularly preferred processing step according to the invention the process may further comprise the step of depositing a thin coating of an organic material over the conductive metal pattern prior to the step of heating the at least one green ceramic sheet. The thin coating of organic material serves to encapsulate the conductive metal pattern so as to prevent its contamination by debris or any other foreign matter during stacking and laminating. The organic coating is depolymerized and burned off during sintering, as is the case with the binder material.

The step of depositing the coating may be easily accomplished by, for example, laying a sheet of coated film material over the conductive metal pattern (with the coating in contact with the conductive metal pattern) and then applying heat and pressure. Simultaneously, the conductive metal pattern is pressed into the softened green sheet and the coating is applied to the surface of the green sheet over the conductive metal pattern. After cooling, the film material (without the coating) is then removed. The application of the coating is aided by selecting a coating that is compatible with the binder material. In this way, the bonding of the coating and the binder material is assured and the facile removal of the film is achieved. To be compatible, the binder material and coating do not need to be made from the same organic material as certain organic materials readily bond to one another. Further, if two different organic materials are otherwise incompatible, their bonding may nevertheless be accomplished by the addition of compatibility agents, as is well known to those skilled in the art. It is preferred, however, that the binder material and coating be made from the same organic material.

Instead of depositing the coating of organic material before the step of heating, the coating may alternatively be deposited after the conductive metal pattern has been pressed into the softened green sheet but before the green ceramic sheets are stacked and laminated. This would require, for example, applying the coated film material and then heating to about 75° C. to cause bonding between the binder and coating. After cooling, the film material (with the coating removed) may then be peeled off. It should be understood that if the coating was applied by methods other than by application of a coated film, the step of heating here may be dispensed with. The binder material and coating should be compatible as previously discussed.

A particularly preferred organic material for the coating is polyvinyl butyral resin, especially when the binder material is also polyvinyl butyral resin. An alternative organic material is polymethyl methacrylate. Generally, it is believed that the thickness of the coating of the organic material should be about 0.0001 to about 0.0002 inches.

According to the invention there is also disclosed a multi-layer ceramic substrate which comprises a plurality of ceramic sheets in the green state, a conductive metal pattern pressed into the at least one ceramic green sheet and a thin coating of an organic material deposited over the conductive metal pattern. The green ceramic sheets are stacked and laminated so as to form a substrate. It can be appreciated then that the multi-layer ceramic substrate essentially comprises an encapsulated metal pattern which can be produced as described previously.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A process for forming a multilayer ceramic substrate comprising the steps of:
   obtaining a plurality of ceramic sheets in the green state, then
   depositing a conductive metal pattern on at least one of the green ceramic sheets, then
   heating the at least one green ceramic sheet so as to soften it, then
   pressing the conductive metal pattern into the at least one green ceramic sheet, then stacking and laminating the green ceramic sheets so as to form a substrate, and then sintering the substrate.

2. The process of claim 1 further comprising the step of depositing a thin coating of an organic material over the conductive metal pattern prior to the step of heating the at least one green ceramic sheet.

3. The process of claim 2 wherein the organic material comprises polyvinyl butyral resin.

4. The process of claim 2 wherein the thickness of the coating is about 0.0001 to about 0.0002 inches.

5. The process of claim 1 further comprising the step of depositing a thin coating of an organic material over the conductive metal pattern prior to the step of stacking and laminating the green ceramic sheets.

6. The process of claim 5 further comprising the step of heating the at least one green ceramic sheet and the coating prior to the step of stacking and laminating the green ceramic sheets.

7. The process of claim 5 wherein the organic material comprises polyvinyl butyral resin.

8. The process of claim 5 wherein the thickness of the coating is about 0.0001 to about 0.0002 inches.

9. The process of claim 1 wherein the ceramic sheets comprise a ceramic selected from the group consisting of cordierite type glass ceramics, spodumene type glass ceramics and alumina type ceramics.

10. The process of claim 1 wherein the step of heating is at about 60° to 90° C.

11. The process of claim 1 wherein the step of pressing is at a pressure of about 50 to 500 psi.

* * * * *